(12) United States Patent
Chacon et al.

(10) Patent No.: US 6,265,890 B1
(45) Date of Patent: Jul. 24, 2001

(54) IN-LINE NON-CONTACT DEPLETION CAPACITANCE MEASUREMENT METHOD AND APPARATUS

(75) Inventors: Carlos M. Chacon, Orlando, FL (US); Sailesh Chittipeddi, Allentown, PA (US); Pradip K. Roy, Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/383,457

(22) Filed: Aug. 26, 1999

(51) Int. Cl.[7] .................................................. G01R 31/02
(52) U.S. Cl. ............................................ 324/765; 324/752
(58) Field of Search ................................ 324/750, 765, 324/659, 752, 679, 676; 438/17, 104, 934, 974; 257/288, 327, 403, 324, 298; 365/149, 184; 422/82.09, 136, 290

(56) References Cited

U.S. PATENT DOCUMENTS

| | | | |
|---|---|---|---|
| 4,812,756 | * 3/1989 | Curtis et al. | 324/158 R |
| 5,773,989 | * 6/1998 | Edelman et al. | 324/765 |
| 6,040,912 | * 3/2000 | Zika et al. | 356/394 |

\* cited by examiner

*Primary Examiner*—Safet Metjahic
*Assistant Examiner*—E P LeRoux

(57) ABSTRACT

A method and apparatus for in-line, non-contact depletion capacitance measurement of a semiconductor wafer using non-contact voltage measurement and non-contact surface photovoltage response.

8 Claims, 3 Drawing Sheets

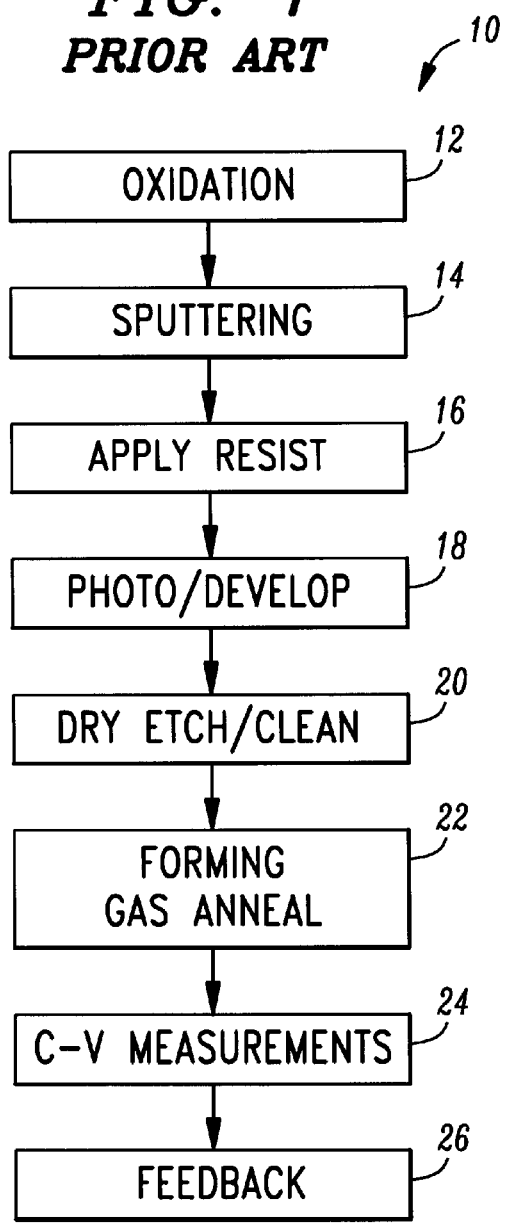
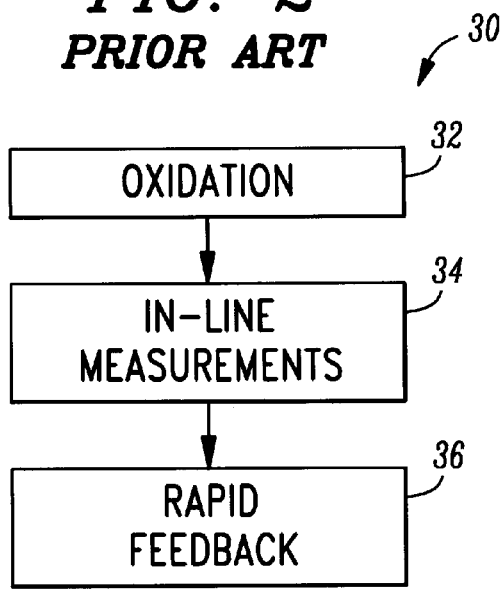

IN-LINE NON-CONTACT DEPLETION CAPACITANCE MEASUREMENT METHOD AND APPARATUS

CROSS-REFERENCE TO RELATED APPLICATIONS (Not Applicable)

STATEMENT REGARDING FEDERALLY SPONSORED RESEARCH OR DEVELOPMENT (Not Applicable)

BACKGROUND OF THE INVENTION

1. Field of the Invention

This invention relates generally to semiconductor wafer testing, and more particularly to a non-contact semiconductor method and apparatus for depletion capacitance measurement of a semiconductor wafer.

2. Description of Related Art

In recent years, gate dielectric thickness of semiconductor wafers has been greatly reduced, and is now approaching both the pinhole and tunneling limits for conventional silicon oxides. During the past ten years, gate oxide dielectric thickness has decreased at an average rate of twelve percent per year. Simultaneously, gate oxide operating fields have increased at approximately 10 percent per year. As we enter the gigabit era, sub-0.25 micron design rules are pushing oxide thickness below 60 Å. New dielectrics, such as lightly nitrided oxides, stacked oxides, and high-k materials, are being developed to meet performance and reliability requirements.

Aggressive oxide scaling and field enhancement have substantially improved low power device performance, but they have also increased the importance of accurate physical and electrical gate oxide characterization. Physical characterization of thin oxides and interfaces has evolved substantially during the past three decades, partly because of developments in ellipsometry, high resolution TEM, x-ray, electron diffraction, and micro-Raman spectroscopy. In contrast, few improvements have been made to electrical characterization methods. Consequently, commercially available non-contact electrical characterization has not kept pace with dielectric thickness developments.

Contact electrical characterization techniques for measuring properties of a semiconductor wafer are available, but they are both inefficient and costly to use. By way of example, capacitance-voltage (C-V), current-voltage (I-V), and full-flow device characterization are effective, but these techniques can only be performed on functioning wafers, meaning that significant semiconductor wafer processing generally must occur before they can be used. Additionally, wafers which have been contaminated during measurement usually are not reused. In contrast, non-contact characterization can be achieved without significantly completing the wafer fabrication process, which speeds process development in research and development facilities. Non-contact measurement also offers significant cost benefits because non-contact techniques seldom damage electrical test wafers.

The significant distinction between contact and non-contact techniques is further illustrated by FIGS. 1 and 2, in which steps of a conventional contact electrical process monitoring technique, metal oxide semiconductor capacitor (MOSCAP) C-V, can be compared to the steps required for a typical in-line, non-contact technique. FIG. 1 specifically depicts an example of a process flow for MOSCAPs 10, which begins with oxidation of a substrate 12. In FIG. 1, the oxidized substrate is exposed to sputtering according to the step of block 14, during which the oxide film on the substrate's surface can be damaged. The substrate is further exposed to the application of photoresist according to the step of block 16, and photolithography and other development according to the step of block 18. The surface next undergoes dry etching and cleaning, in accordance with block 20, which can damage the wafer's surface. After dry etching and cleaning, gas annealing occurs in order to repair damage which has occurred to the wafer during this process 10, according to the step of block 22. After annealing, C-V measurements can be taken for the wafer's surface, according to the step of block 24, and the results can be provided to a process observer, according to the step of block 26. Thus, sputtering, dry etching and cleaning, and/or gas annealing may modify the initial oxide properties of the wafer. Poly-MOSCAP processing, often used on thin gate oxides to prevent metal punch-through, can modify the initial oxide quality still further. Additionally, significant wafer fabrication occurs before measurements are obtained.

In contrast, in-line, non-contact measurement is more efficient, and avoids damage to the surface being monitored. FIG. 2 illustrates an in-line, non-contact measurement process 30, in which a wafer's surface is oxidized 32, in-line, non-contact measurements are taken 34, and the results of the measurements are rapidly provided to a process observer 36. The elimination of several process steps which can damage the quality of the oxide layer on the wafer's surface saves time and protects the oxide layer.

Currently, there are several commercially available options for in-line, contact monitoring of oxide and silicon quality, but each of these contact methods has significant disadvantages. One such method is the film gap technique, which can characterize oxide charge, near surface doping, near surface recombination lifetime, and density of interface traps. The underlying principal of the film gap technique is similar to that of a high-frequency C-V plotter, in which a DC electrical bias is swept while an AC stimulus is applied to the silicon. During the film gap method, the stimulus is a modulated light source, and the AC photoresponse is capacitively coupled to a transparent electrode which is separated from the sample by a Mylar™ film. Although this technique is compact and relatively inexpensive, the Mylar™ sheet cannot withstand high temperatures, preventing mobile charge testing. The contacting nature of the technique sometimes results in cross-contamination between wafers, and therefore damage to the oxide layer. Additionally, any probes which are used for measuring must be carefully monitored for charge build-up in order to avoid false detection of oxide charge.

Mercury probe analysis is another well-established, in-line, non-contact technique which is suitable for monitoring a wide variety of oxides. In particular, the technique can measure the electrical properties of very leaky oxides because the mercury probe can source a large compliance current. During this process, a mercury "dot" is placed on the wafer. Conventional reliability testing metrics such as charge (Q) and current density-voltage (J-V) analysis can be carried out with mercury probe stations. Although C-V monitoring is also possible with mercury probes, the technique does not lend itself to mobile charge analysis since the mercury dot cannot be heated. Wafers are usually not reused after exposure to mercury, and high speed scanning techniques that rely on photovoltaic effect cannot be used due to the opaque nature of the mercury electrode.

Bulk diffusion length measurement provides a third in-line, contact method. With this technique, several different wavelengths of light generate photoinduced carriers, and the surface photovoltage signal is monitored as a function of the light penetration depth. Samples with a long diffusion length will allow carriers generated deep in the silicon bulk to diffuse back to the surface, while samples with low bulk diffusion length or lifetime will have little photoresponse to long-wavelength photoexcitation. This technique excels in monitoring bulk silicon quality when the bulk diffusion length is less than half the wafer thickness, and may be combined with temperature cycling to generate maps of bulk iron concentration.

Recently, mathematical modeling of the assumed front and rear wafer surface recombination rates has become necessary to extract the bulk diffusion length from today's higher quality silicon. Thus, the condition of the wafer's surface at the front and the back of the sample plays an increasing role in the measurement response as bulk lifetime increases, and variations in surface recombination velocity, which is strongly bias dependent, cause difficulties when using this technique. Significantly, this technique was not designed to study the condition of the substrate near its surface. Additionally, it cannot be used to study epitaxial silicon, which is commonly found in new dielectrics.

Present contact depletion C-V measurements involve the use of a pn or Schottky diode, which has a junction capacitance (C), a junction conductance (G), and a series resistance (rs). When contact depletion C-V measurements are taken, the measured depletion capacitance (Cm) is related to the true depletion capacitance (C) by $$Cm = \frac{C}{[(1+(rs)(G))]^2 + [2(rs)(C)]^2}.$$

This contact depletion C-V measurement technique requires metallized contacts on a surface of the wafer being measured. These contacts can damage the wafer's surface and can prevent accurate measurements from being taken.

SUMMARY OF THE INVENTION

The present invention relates to a corona-oxide-semiconductor (COS) technique which measures the depletion capacitance of a semiconductor wafer. The depletion capacitance can be defined as the capacitance of the junction region between a p-type layer and an n-type layer of a semiconductor wafer. The apparatus and method of the invention use a non-contact voltage measurement, a surface photovoltage measurement, and known n-type and p-type doping concentrations to calculate depletion capacitance. The invention is particularly useful for in-line, non-contact electrical characterization of advanced oxides and silicon.

A method for in-line, non-contact depletion capacitance measurement of a test semiconductor wafer, according to the invention, comprises the steps of oxidizing the surface of a control wafer and the surface of a test wafer having a junction depletion region, measuring a control wafer surface voltage potential and a test wafer surface voltage potential with a non-contact electrostatic measurement means, directing a pulsed light source against the control wafer and the test wafer, measuring a control wafer surface photovoltage and a test wafer surface photovoltage with a non-contact SPV measurement means, and determining the depletion capacitance of the test wafer. The test wafer's depletion capacitance is calculated on the basis of the junction depletion region voltage, which is the difference between the photovoltage and surface voltage of the control wafer and the photovoltage and surface voltage of the test wafer, and known doping concentrations for the test wafer's n-type region and p-type region.

An apparatus for in-line, non-contact depletion capacitance measurement of a test semiconductor wafer, according to the invention, comprises a means for oxidizing the surface of a control wafer and the surface of a test wafer having a junction depletion region, a non-contact electrostatic measurement means for measuring a control wafer surface voltage potential and a test wafer surface voltage potential, a light source for directing a pulsed light against the control wafer and the test wafer, an SPV measurement means for measuring a control wafer surface photovoltage and a test wafer surface photovoltage, and a means for determining the depletion capacitance of the test wafer on the basis of the junction depletion region voltage, which is the difference between the photovoltage and surface voltage of the control wafer and the photovoltage and surface voltage of the test wafer, and known doping concentrations for the test wafer's n-type region and p-type region.

BRIEF DESCRIPTION OF THE DRAWINGS

There are presently shown in the drawings embodiments which are presently preferred, it being understood, however, that the invention is not limited to the precise arrangements and instrumentalities shown, wherein:

FIG. 1 is a process flow diagram for a conventional C-V electrical characterization method.

FIG. 2 is a process flow diagram for an in-line, non-contact electrical characterization method.

DETAILED DESCRIPTION OF THE PREFERRED EMBODIMENTS

Figure 3:
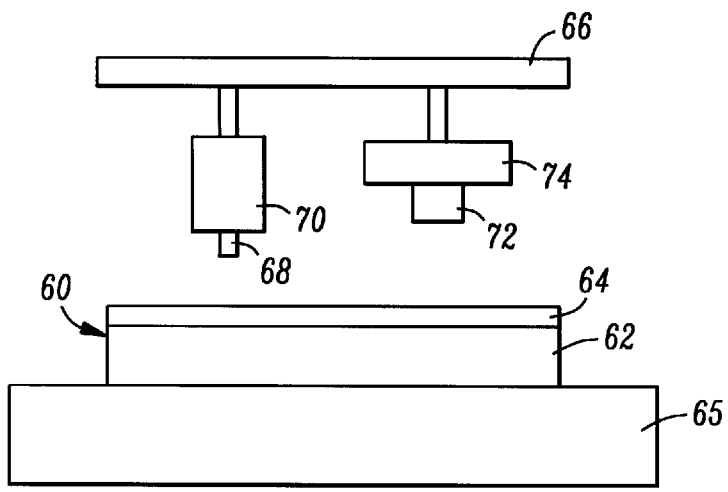
FIG. 3 is a schematic of the apparatus of the present invention.

The invention relates to a method and apparatus for in-line, non-contact semiconductor depletion capacitance measurement. Referring now to FIG. 3, an in-line, non-contact semiconductor depletion capacitance measurement apparatus is shown. In FIG. 3, a wafer 60 comprises a substrate 62 and a dielectric oxide layer 64. The wafer 60 can be held securely in place on a wafer chuck 65 by an external vacuum source (not shown).

An electrostatic measurement means 68 enables measurement of a surface voltage (Vs) of the wafer 60, and may be situated in any suitable manner, preferably above the oxide layer 64. The electrostatic measurement means 68 comprises a non-contact means for measuring the voltage changes between the oxide layer 64 and the substrate 62. The electrostatic measurement means 68 may be any non-contact electrostatic voltmeter and, in the preferred embodiment of FIG. 3, it is a vibrating Kelvin probe, an apparatus which is well known in the art, as described in U.S. Pat. No. 4,541,012. In this preferred embodiment, a mechanical oscillator 70 manipulates the Kelvin probe so that it vibrates.

The apparatus also comprises a means for measuring the surface photovoltage (SPV). This SPV measurement means 72 is a non-contact SPV probe, and may be any non-contact device suitable for SPV measurement, such as that described in U.S. Pat. No. 4,551,671. A light source 74 provides the light necessary for SPV measurement, and is preferably a laser which generates laser-pulsed radiation. In a preferred embodiment, the electrostatic measurement means 68 and the light source 74 can be suitably attached to a positioning means 66 located above the oxide layer 64, and can be moved by the positioning means 66 to any point above a wafer's surface.

Figure 4A:
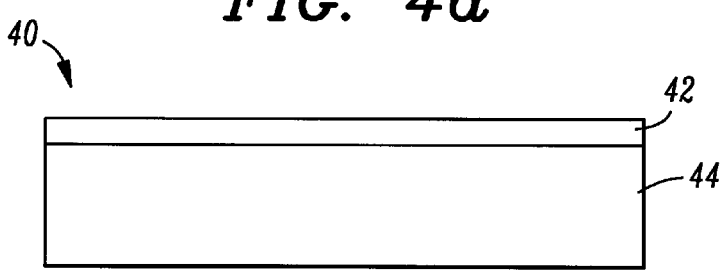
FIG. 4a is a schematic of a semiconductor wafer.
Figure 4B:
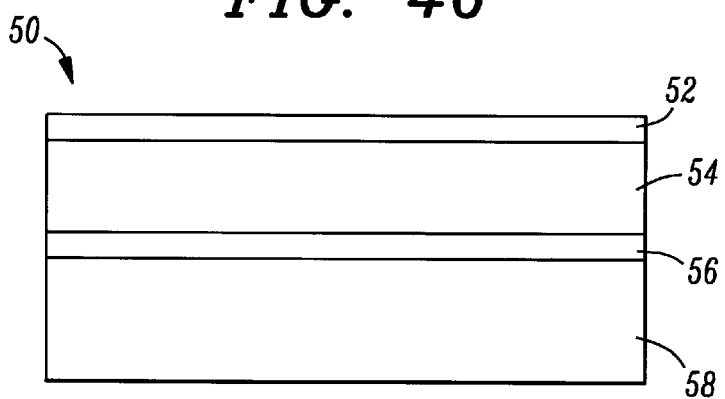
FIG. 4b is a schematic of the semiconductor wafer shown in FIG. 3.

FIGS. 4a and 4b illustrate an example of combining non-contact voltage measurement and non-contact surface photovoltage response to calculate the depletion capacitance of a wafer. FIG. 4a shows a first wafer 40 having a first oxide layer 42 and a first dielectric layer 44 which is preferably a silicon layer, although the invention is not limited in that regard. The first dielectric layer 44 can be a p-type material or an n-type material.

FIG. 4b shows a second wafer 50, having a second oxide layer 52, a second dielectric layer 54, a depletion junction region 56, and a third dielectric layer 58. The second and third dielectric layers 54, 58 are preferably silicon layers, however, the invention is not limited in that regard. One of the second and third dielectric layers 54, 58 is a p-type material and the other dielectric layer is an n-type material. The depletion junction region 56 is the region of transition between the p-type material and the n-type material.

Figure 5:
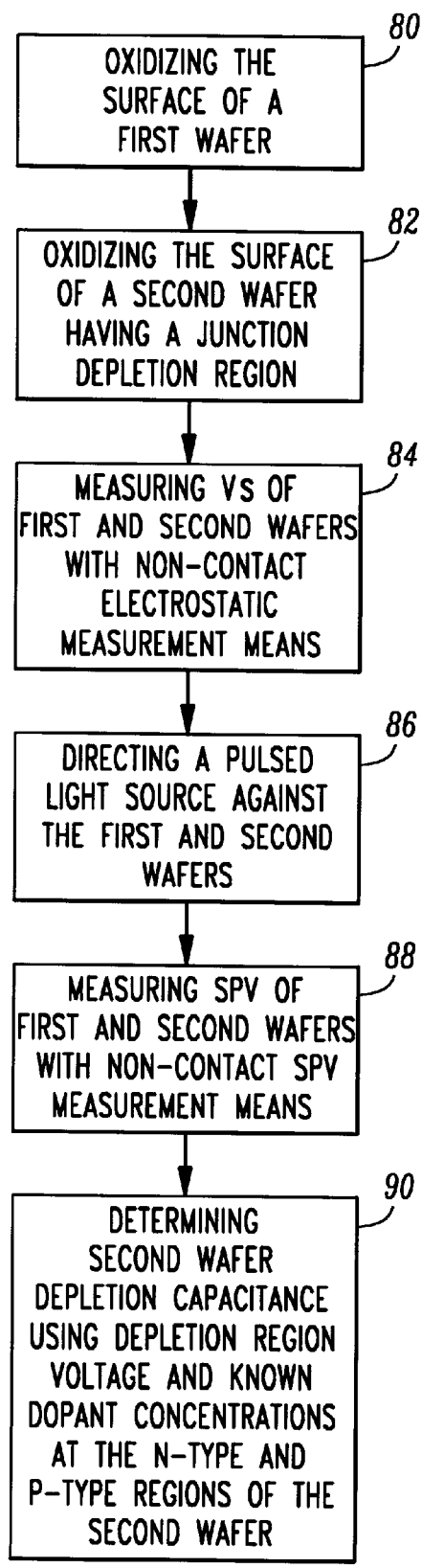
FIG. 5 is a process flow diagram of the method of the present invention.

A preferred embodiment of the apparatus of the invention is illustrated in FIGS. 4a–4b, and a preferred embodiment of the method of the invention is shown in FIG. 5. According to the invention, an oxide film is deposited on a first dielectric layer 44 by any suitable deposition means, according to the step of block 80. Suitable deposition means are well known in the art, and any such means can be used to form a first oxide layer 42. In a preferred embodiment, Vs measurements are taken for the first wafer 40 using a non-contact electrostatic voltmeter, as described above and as shown in the step of block 84. SPV measurements are obtained for the first wafer 40 using a non-contact SPV measurement means 72 such as a pulsed light source, as described above, and as shown in step 86 and 88. The Vs and SPV measurements for the first wafer 40 can be combined to define a first wafer total voltage.

An oxide film is also deposited on the second dielectric layer 54 by any suitable deposition means, forming a second oxide layer 52, as described in step 82. Vs and SPV measurements are taken for the second wafer 50, as described in steps of blocks 84, 86, and 88. The Vs and SPV measurements for the second wafer 50 can be combined to define a second wafer total voltage. Depletion region voltage can be calculated by subtracting the first wafer total voltage from the second wafer total voltage.

The n-type and p-type doping concentration levels of the second wafer 40 will be a known quantity if these levels are recorded after the depletion region is implanted in the second wafer 50. Using known doping concentration levels of the second wafer 50 and the measured depletion region voltage of the second wafer 50, depletion capacitance of the second wafer 50 can be calculated, in accordance with the step of block 90. Thus, the invention provides depletion capacitance measurements by non-destructive testing which is significantly more time-efficient than conventional MOS techniques.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

What is claimed is:

1. A method for in-line, non-contact depletion capacitance measurement of a test semiconductor wafer, the method comprising:

oxidizing a control wafer, and oxidizing a test wafer having a junction depletion region;

measuring a control wafer surface voltage potential and a test wafer surface voltage potential with a non-contact electrostatic measurement means;

directing a pulsed light source against the control wafer and the test wafer;

measuring a control wafer surface photovoltage and a test wafer surface photovoltage with a non-contact SPV measurement means; and determining a depletion capacitance of the test wafer on the basis of the difference between the control wafer surface photovoltage and the control wafer surface voltage and the test wafer photovoltage and the test wafer surface voltage, and known dopant concentrations at the n-type and p-type regions of the test wafer.

2. The method of claim 1 wherein the electrostatic measurement means is an electrostatic voltmeter.

3. The method of claim 2 wherein the electrostatic voltmeter is a Kelvin probe.

4. The method of claim 1 wherein said pulsed light source is a laser which generates laser pulsed radiation.

5. An apparatus for in-line, non-contact depletion capacitance measurement of a test semiconductor wafer, the apparatus comprising:

a means for oxidizing a control wafer, and oxidizing a test wafer having a junction depletion region;

a non-contact electrostatic measurement means for measuring a control wafer surface voltage potential and a test wafer surface voltage potential;

a light source for directing a pulsed light against the control wafer and the test wafer;

a SPV measurement means for measuring a control wafer surface photovoltage and a test wafer surface photovoltage; and a means for determining the depletion capacitance of the test wafer on the basis of the charge deposition and a difference between the control wafer surface photovoltage and the control wafer surface voltage potential and the test wafer surface photovoltage and the test wafer surface voltage potential, and known dopant concentrations at the n-type and p-type regions of the test wafer.

6. The apparatus of claim 5 wherein the electrostatic measurement means is an electrostatic voltmeter.

7. The apparatus of claim 6 wherein the electrostatic voltmeter is a Kelvin probe.

8. The apparatus of claim 5 wherein said pulsed light source is a laser which generates laser pulsed radiation.

* * * * *